United States Patent
Nenyei et al.

(10) Patent No.: US 7,704,898 B2
(45) Date of Patent: Apr. 27, 2010

(54) METHOD FOR THE THERMAL TREATMENT OF DISK-SHAPED SUBSTRATES

(75) Inventors: Zsolt Nenyei, Blaustein (DE); Steffen Frigge, Niederwiesa (DE); Patrick Schmid, Dornstadt (DE); Thorsten Hülsmann, Dornstadt (DE); Thomas Theiler, Ulm (DE)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 11/659,587

(22) PCT Filed: Oct. 28, 2004

(86) PCT No.: PCT/EP2004/012181

§ 371 (c)(1),
(2), (4) Date: May 1, 2008

(87) PCT Pub. No.: WO2006/015620

PCT Pub. Date: Feb. 16, 2006

(65) Prior Publication Data

US 2008/0311761 A1    Dec. 18, 2008

(30) Foreign Application Priority Data

Aug. 13, 2004 (DE) .................. 10 2004 039 443

(51) Int. Cl.
*H01L 21/00* (2006.01)
(52) U.S. Cl. .................. 438/795; 438/584; 438/660; 438/685; 438/688; 257/E21.094; 219/390; 219/411; 118/724; 118/728; 118/729; 392/416; 392/418

(58) Field of Classification Search .................. 438/795, 438/584, 660, 685, 688; 257/E21.094; 219/390, 219/411; 118/724–725, 728, 733, 729; 392/416, 392/418
See application file for complete search history.

(56) References Cited

U.S. PATENT DOCUMENTS 5,102,496 A    4/1992    Savas (Continued)

FOREIGN PATENT DOCUMENTS

DE    A4437461    4/1996

(Continued)

OTHER PUBLICATIONS

Article—*Particle Deposition, Adhesion & Removal*, Mat Res Soc Symp Proc, 315, 1993.

(Continued)

*Primary Examiner*—Sue Purvis
*Assistant Examiner*—Whitney Moore
(74) *Attorney, Agent, or Firm*—Dority & Manning, P.A.

(57) ABSTRACT

Disclosed is an apparatus and a method for reducing flash in an injection mold (532 or 542,543) which molds a molded article between a first mold surface and a second mold surface. The apparatus includes an active material actuator (530 or 533*a* and 533*b* or 561*a* and 561*b*) configured to, in response to application or removal of an electrical actuation signal thereto, change dimension and urge the first mold surface relative to the second mold surface to reduce flash therebetween. The apparatus also includes a transmission structure (533) configured to provide in use, the electrical actuation signal to said active material actuator (530 or 533*a* and 533*b* or 561*a* and 561*b*) includes a set of active material actuators stacked one against the other to provide a varying sealing force to urge the first mold surface relative to the second mold surface.

34 Claims, 4 Drawing Sheets

U.S. PATENT DOCUMENTS

| | | | |
|---|---|---|---|
| 5,302,209 A * | 4/1994 | Maeda et al. | 118/719 |
| 5,359,693 A | 10/1994 | Nenyei et al. | |
| 5,580,830 A | 12/1996 | Nenyei et al. | |
| 5,861,609 A | 1/1999 | Kaltenbrunner et al. | |
| 5,965,047 A | 10/1999 | Blersch et al. | |
| 6,005,226 A | 12/1999 | Aschner et al. | |
| 6,017,437 A | 1/2000 | Ting et al. | |
| 6,017,820 A | 1/2000 | Ting et al. | |
| 6,111,225 A * | 8/2000 | Ohkase et al. | 219/390 |
| 6,151,447 A | 11/2000 | Moore et al. | |
| 6,281,141 B1 | 8/2001 | Das et al. | |
| 6,614,005 B1 * | 9/2003 | Walk et al. | 219/390 |
| 6,737,367 B1 | 5/2004 | Drechsler et al. | |
| 6,770,146 B2 | 8/2004 | Koren et al. | |
| 7,004,716 B2 | 2/2006 | Graf et al. | |
| 2003/0127049 A1 * | 7/2003 | Han et al. | 118/715 |
| 2005/0006916 A1 | 1/2005 | Mantz | |

FOREIGN PATENT DOCUMENTS

| | | |
|---|---|---|
| WO | WO 99/27563 | 6/1999 |
| WO | WO 2004/013902 | 2/2004 |

OTHER PUBLICATIONS

Article—*Mechanisms of particle Transport in Process Equipment*, J. Electrochem Soc, vol. 140:Oct. 10, 1993, pp. 2917.

* cited by examiner

METHOD FOR THE THERMAL TREATMENT OF DISK-SHAPED SUBSTRATES

The present invention relates to a method for the thermal treatment of disk-shaped substrates, especially semiconductor wafers in at least one process chamber, whereby the substrate is heated in a first process step whilst being kept static or when a gas is not being introduced into the process chamber.

During the production of semiconductor components, the semiconductors are exposed to different processes. Some of these processes comprise a thermal treatment of the substrates wherein the substrates are exposed to a desired temperature time profile.

High-speed heating systems also called rapid thermal processing (RTP) systems, such as are known from the U.S. Pat. Nos. 5,359,693 and 5,580,830 for example, are usually used for this purpose. However, other semiconductor processing plants are also extremely well known in the semiconductor manufacturing field, such as e.g. CVD plants or plasma plants such as are known from the U.S. Pat. No. 5,102,496 for example.

Plants of this type are employed for the treatment of semiconductor wafers which usually consist of silicon although they could consist of other semiconductor materials such as germanium, SiC or other compound semiconductors.

Plants that are used for the production of semiconductor wafers must meet heavy demands in regard to freedom from particles since, with the increasingly smaller structural topographies on the semiconductor wafers, the need for the wafers to be free of particles plays an ever greater role. Particles are interfering factors when producing integrated semiconductor components from wafers since they can drastically reduce the yield, i.e. the number of functional chips per wafer. Particles having sizes of between 100 nm and 1 µm are particularly disturbing at the present time since the structural widths of the semiconductor chips also lie in this general order of magnitude.

One therefore endeavours to keep the number of particles on the wafers as small as possible. Nowadays, this is achieved, inter alia, by virtue of the fact that integrated semiconductor components are manufactured practically exclusively in essentially dust- and particle-free clean rooms. Furthermore, attempts are made to minimize insofar as possible the emissions from particle generators (humans, machines, transport equipment, robots or other clean room mechanisms) which can come into contact with the wafer directly or through the atmosphere of the clean room. Nevertheless, complete freedom from particles cannot be ensured since the clean room atmosphere surrounding the wafer is never completely free of particles. Furthermore, it is not possible to completely prevent the objects, such as the e.g. processing units or robots which come into contact with the wafer, from producing particles by frictional abrasion and transferring them to the wafer. Here too, an effect referred to as "cross-contamination" is also known, this being understood as the transmission of particles from one wafer to the others. Thus, when processing several semiconductor wafers in a processing unit, particles can be transferred from one wafer to the others either directly between the wafers or indirectly from one wafer to another wafer via the wafer processing system.

The mechanisms by which particles can be transferred to a wafer are very varied and may partly work against one another. The net particle transfer and the proportion of particles remaining on the wafer surface in the course of a process, which can result in a reduction of the yield from the process, depend on numerous factors. Some of the material-related factors are, for example, the particle size, the shape of the particle and the nature of the particle carrying surfaces (the wafer, the material surfaces of the processing unit). Other factors are, for example, physically effective forces such as gravitation, convection, diffusion, Brownian movement, adhesion, Van der Waals forces, Coulomb forces and photoelectric forces or the effects thereof such as sedimentation, electrophoresis, thermophoresis, photophoresis or chemical action (e.g. decay or burning of the particles to gaseous single components). In regard thereto, see also: "Particle deposition, adhesion and removal" in Mat. Res. Soc. Symp. Proc. Volume 315, 1993 of the Materials Research Society.

The thermal treatment of semiconductor wafers is predominantly managed today using single disk high-speed heating systems. These systems, which are also referred to as RTP plants, are to be understood as being semiconductor manufacturing plants which are capable of heating a semiconductor wafer to high temperatures in a very short period of time. Thereby, the heating device frequently consists of halogen and/or arc lamps which heat the wafer from the front and/or the rear. Here, the front is to be understood as being the side on which the structures for semiconductor components are formed or are to be formed.

For the attainment of certain process results, a process gas is frequently introduced into a reaction chamber containing the wafer during the thermal treatment. The temperature of the wafer should be adjustable during the thermal treatment in such a manner that it follows a given temperature time profile. For the attainment of a uniform process result over the whole extent of the wafer, it is important especially in the case of highly reactive processes that there should be only minimal differences of temperature over the whole extent of the wafer. A homogeneous temperature over the whole extent of the wafer is also necessary for preventing damage to the structure of the wafer. Various mechanisms are known in this technical field for assisting the process of producing a homogeneous temperature distribution over the whole of the semiconductor wafer.

For example, it is known to rotate the semiconductor wafer during a thermal treatment in order to prevent the occurrence of local temperature inhomogeneities due to imaging of the heating sources on the wafer. Here, the rotation devices used for this purpose can produce particles by mechanical abrasion, such particles then settling on the wafer and thus leading to an increase in the number of particles thereon which, as described above, can damage the semiconductor wafer. Whereas particles located on the back of the wafer usually interfere with the process of sharply imaging the microstructures of the different mask levels during the lithographic process, the particles on the front of the wafer (so-called killer particles) often contribute directly to the decrease in the chip yield.

Apart from the particles produced by the rotation process, further particles may also occur in the reaction chamber, these being present in the form of e.g. precipitation and being produced by evaporation of the upper surface layers of the wafer. Particles of this type can be whirled up by the introduction of the process gas and/or the rotation of the wafer and thus settle on the wafer being treated.

Consequently, the object of the present invention is to reduce the number of particles on substrates, in particular, on semiconductor wafers which are being thermally treated.

This problem is solved in a method of the type mentioned hereinabove in that the substrate continues to be heated in a second process step following the first process step and is set in motion. Due to the fact that the substrate is initially heated statically i.e. kept motionless in a first process step, it may be achieved that the temperature of the wafer exceeds the temperature of its immediate environment. This thus results in a temperature gradient having a higher temperature at or immediately adjacent to the wafer and a lower temperature further away from the wafer. Due to this temperature gradient, those particles that are in the direct proximity of the wafer are moved away from the wafer due to thermophoretic effects.

The expression thermophoresis is to be understood as meaning a force which develops due to a local thermal gradient and which affects a particle present in the gradient field in such a manner that the particle moves toward the lower temperature. For example, if a substrate is hot and the gas surrounding the substrate is colder, there is a resultant thermal gradient perpendicular to the surface of the substrate. This thermal gradient has the consequence that particles, which are on or very close to the substrate, tend to move away from the substrate towards the lower temperature.

However, such local thermal fields can also develop due to the different energetic absorptive properties of particles which are only surrounded by gas. If, for example, a particle is heated by radiant energy to a greater extent than a gas surrounding the particle, then a temperature gradient develops between the particles and the immediate environment of the particle which is effective to accelerate the particle in the direction in which the gas temperature is lower. Hereby, a preferred direction of motion for a particle can be produced e.g. by heating the particle from only one side by means of an optical radiation device. In the optical shadow of the particle, a colder zone then develops in the gas surrounding the particle as compared with the irradiated side of the particle. This has the consequence that the kinetic energy of the gas molecules on the irradiated side of the particle is higher than on the non-irradiated side. Due to the temperature gradient that is defined in this way, the particle is moved toward the colder zone, i.e. away from the radiation source. This effect is referred to as radiometry and has a dominating effect on free particles (these are particles which are not located on a solid surface), said force being directed away from the radiation particularly in the range below approximately 100 torr. The radiometry effect can thus be regarded as a special case of thermophoresis.

A further effect is the effect of the radiation pressure which results from the fact that radiation can be reflected or absorbed by a particle. Each impulsive change of a photon hitting a particle caused by reflection or absorption must be compensated by an opposite impulsive change of the particle, for which the consequence is that the direction of motion of the particle changes. Particles reflected back perpendicularly cause the largest impulsive change in the case of a photon. The consequence of the radiation pressure is that the particles move away from the radiation source. Radiation pressure and radiometry are referred to in the technical literature by the term photophoresis (J. Electrochem. Soc., volume 140, No. 10, October 1993, pages 2917 et seq).

Due to the fact that the wafer is initially kept static until it has reached a temperature which is higher than that of its immediate environment, no particles are produced and/or whirled up by a movement until the onset of the thermophoretic effect. When the wafer is set in motion in the course of a second process step, the above mentioned thermophoretic effects work in such a manner that particles which are produced or whirled up by the movement and arrive in the vicinity of the wafer are moved away from the wafer and do not reach the surface of the wafer at all. Should particles ever reach the wafer surface, the thermophoretic forces are often not sufficient to detach them from the wafer surface since the adhesive forces effective at this point in time may be still greater than the thermophoretic effects.

The procedure in accordance with the invention thus reduces in a simple and economical way the number of particles reaching a substrate in that any possible production of particles and turbulence only begins at a time point at which the thermophoretic effects tend to move the particles away from the wafer.

In a preferred embodiment of the present invention, the end of the first process step is determined by the attainment of a first temperature T1 or by the expiry of a certain time period t1. The determination of the end of the first process step by the attainment of a first temperature T1 can ensure that the wafer is at a certain temperature which is higher than that in the immediate environment of the wafer before the wafer is set in motion. A pyrometer is frequently used for measuring the temperature of the wafer in plants for the thermal treatment of semiconductor wafers. However, pyrometers frequently cannot take exact temperature measurements at temperatures under 450° C. so that the end of the first process step can be determined in advantageous manner by the the expiry of a certain time period t1. With a knowledge of the nominal heat power, the aforesaid certain time period can be correlated with an approximate temperature value of the wafer, this being sufficient for the present procedure. An exact temperature measurement is not therefore necessary in every case.

Advantageously, the substrate is heated in the second process step to a second temperature $T_{max}$ which is higher than a temperature T1 of the substrate at the end of the first process step because it is precisely at such higher temperatures where homogenisation of the surface temperature of a substrate is necessary by virtue of its movement.

In order to provide good homogenisation of the surface temperature of the substrate, the movement occurring in the second process step is preferably a rotational movement.

In one embodiment of the present invention, the substrate is moved from a first to a second process chamber between the first and second process steps, whereby the first and second process steps can be heated in different environments and/or by means of different heating devices. Thus, for example, a resistance heating element can be provided in a first process chamber for the first heating process in order to raise the substrate to a first temperature, whereas it can be heated by means of heating lamps in the second process chamber for example. Different process atmospheres could also be provided in the first and second process chambers, these being optimised for the respective process steps. Furthermore, for example, the throughput of a plant could be increased if use is made of a first process chamber in the form of a lock chamber to the second process chamber, through which the substrate would also have to pass in normal conditions.

Preferably, the process chamber containing the substrate also contains a gas at least during the first process step, whereby the substrate is heated more quickly during its heating process than the gas surrounding the substrate. A gas atmosphere around the substrate supports the build up of a thermal gradient away from the wafer and thus promotes the thermophoretic effect. Hereby, the gas atmosphere in the process chamber containing the substrate is preferably at a pressure of between 700 and 900 torr, for which the usual heating devices are appropriate. In order to provide a uniform and, if necessary, a renewing gas atmosphere around the substrate, a gas is preferably introduced into the process chamber containing the substrate. For the purposes of controlling the processes running during the thermal treatment, the gas atmosphere in the process chamber containing the substrate is preferably changed. Preferably, the temperature of the gas introduced into the process chamber containing the substrate is lower than that of the substrate in order to prevent the development of a thermal gradient having a reducing temperature toward the substrate.

In a preferred embodiment of the invention, the gas is an ionised gas in order to neutralize local charges on the surface of a substrate and possibly suppress particles from adhering thereto by virtue of such charges. The polarity of the ionised gas is preferably changed in order to enable local charges of differing prefix signs to be neutralized. In one embodiment of the invention, the gas is ionised within the process chamber. In order to prevent particles present in the process chamber from being whirled up during the first process, it is preferable that no gas be introduced into the process chamber containing the substrate during the first process step. Since reactions occurring between the gas in the process chamber and the substrate surface are usually more intense at higher temperatures, an exchange of the gas atmosphere is not absolutely necessary in the first process step. However, withdrawal of gas from the process chamber containing the substrate could be enabled at least during the first process step in order to prevent an increase of pressure within the process chamber due to the heating of the gas.

In one embodiment of the invention, at least one of the process steps is accomplished in a sub-atmospheric pressure range in order to obtain certain process results. Hereby, it is the photophoretic effects which predominate in the sub-atmospheric pressure range.

In order to create a sufficient temperature gradient in the environment of the substrate, the substrate is heated to at least 50° C., and in particular to at least 100° C. in the first process step since the immediate environment of the substrate is generally at the ambient temperature before the beginning of the first process step. On the other hand, in order to prevent temperature inhomogeneities over the whole extent of the substrate at high temperatures, the substrate is preferably heated to a temperature of <400° C. and in particular, to a temperature of <300° C. in the first process step.

For the purposes of achieving a significant rise in temperature within the first process step, the certain time period t1 amounts to at least 1 second, and in particular to at least 2 seconds. Thereby, consideration should be given to the fact that modern high-speed heating systems are capable of producing heating rates of 150° C. and more per second. For an efficient process, the certain time period t1 amounts to at most 10 seconds, and in particular to at most 5 seconds.

In accordance with a preferred embodiment of the invention, the substrate is heated at least in the first process step to a temperature which is higher than the temperature of the process chamber containing the substrate. This thus prevents a temperature gradient from developing whose temperature decreases towards the substrate this thus ensuring that no particles are moved toward the substrate due to thermophoretic effects.

For effective and efficient thermal treatment, the substrate is heated in at least one of the process steps from the two main sides thereof. High heating rates can thereby be efficiently achieved, and furthermore, temperature inhomogeneities throughout the thickness of the substrate can be reduced. Advantageously however, the substrate is heated to a greater extent on one of the two main sides of the substrate than on the other at least during the first process step. The result is thereby achieved that in addition to the aforementioned thermophoretic effects, photophoretic effects also come into effect, these being directed away from at least one of the two main sides. Hereby, the heating power effective on the one side is preferably about at least 10%, and in particular at least 50% greater than that on the other side in order to enhance the effect. In one embodiment of the invention, the substrate is heated exclusively from the one side particularly during the first process step in order to enhance this effect. This is particularly advantageous even in the case of a two-chamber system since only one heating device has to be provided on one side of the substrate in the first process chamber. Here, the one side from which the substrate is predominantly heated is preferably the rear face of a semiconductor wafer. This thereby provides special protection for the front face of the substrate on which structures will subsequently be formed, or upon which structures have already been formed.

It is advantageous for the substrate to be heated by the radiation from at least one heating lamp at least in the second process step, this thereby enabling the heating process to be effected rapidly in non-contact-making manner. Preferably, there is provided at least one element which absorbs the radiation and is arranged adjacent to and above and/or below the substrate, and which element radiates heat rays at a frequency different to that radiated by the lamp. The substrate is thereby shaded from the direct radiation of the lamp and photophoretic effects are reduced thereby. Moreover, the radiation from the lamp is converted by the element into a radiation of lower colour temperature, something which can lead to more homogeneous heating of structured substrates, such as a semiconductor wafer for example, in certain temperature ranges. It is known for example that semiconductor wafers are, to a large extent, transparent to certain lamp radiations in the lower temperature ranges. In order to provide shading from the radiation of the lamp, the lamp radiation absorbing element is preferably arranged between the at least one heating lamp and the substrate.

In order to enable the movement or rotation of the substrate in the process chamber to be as particle-free as possible, the substrate is preferably set in rotation by a gas that is introduced into the process chamber. Hereby, the substrate or a holding device for the substrate is preferably held in floating manner by a gas that is introduced into the process chamber so as to prevent friction between different elements. Hereby, a gas inlet and/or a holding device for the substrate are essentially transparent to the heating radiation used for heating the substrate in order not to impair the heating process. The gas introduced into the process chamber is preferably a process gas for processing the substrate, whereby a simultaneous inlet of gas and movement of the substrate is made possible in a particularly simple manner.

In accordance with one embodiment of the invention, the substrate is cooled down in a third process step, whereby the movement of the substrate and/or the introduction of a gas into the process chamber containing the substrate is/are stopped at the end of the third process step before the substrate reaches a temperature which is lower than or equal to that of its immediate environment. The result is thereby achieved that particle production and/or turbulence is stopped as long as thermophoretic forces are effective away from the substrate. Hereby, the end of the third process step is preferably determined by the attainment of a third temperature T3 or by the expiry of a certain time period t3. The advantages already mentioned above in regard to the first process step thereby result. Furthermore, in the third process step, the substrate is preferably cooled down to a third temperature T3 which is lower than the second temperature $T_{max}$ and higher than or equal to the temperature T1 of the substrate at the end of the first process step.

The problem underlying the present invention is solved in the case of a method for the thermal treatment of disk-shaped substrates especially semiconductor wafers in at least one process chamber containing a gas wherein the substrate is heated in a first process step during which no gas is introduced into the process chamber, in that the substrate is further heated in a second process step and gas is additionally introduced into the process chamber. Due to the fact that no gas is introduced during the first process step, particles are prevented from being whirled up by the introduction of gas into the chamber before the substrate has been heated above the temperature of its immediate environment. If particles are whirled up by the introduction of a gas in the second process step, thermophoretic effects work away from the substrate.

A plurality of the process steps specified hereinbefore is also advantageous for the last-mentioned procedure.

The present invention will be described in more detail hereinafter on the basis of a preferred exemplary embodiment of the invention taken with reference to the drawing. In the drawing:

FIG. 2b shows a partial sectional view through the part in FIG. 2a;

Figure 1:
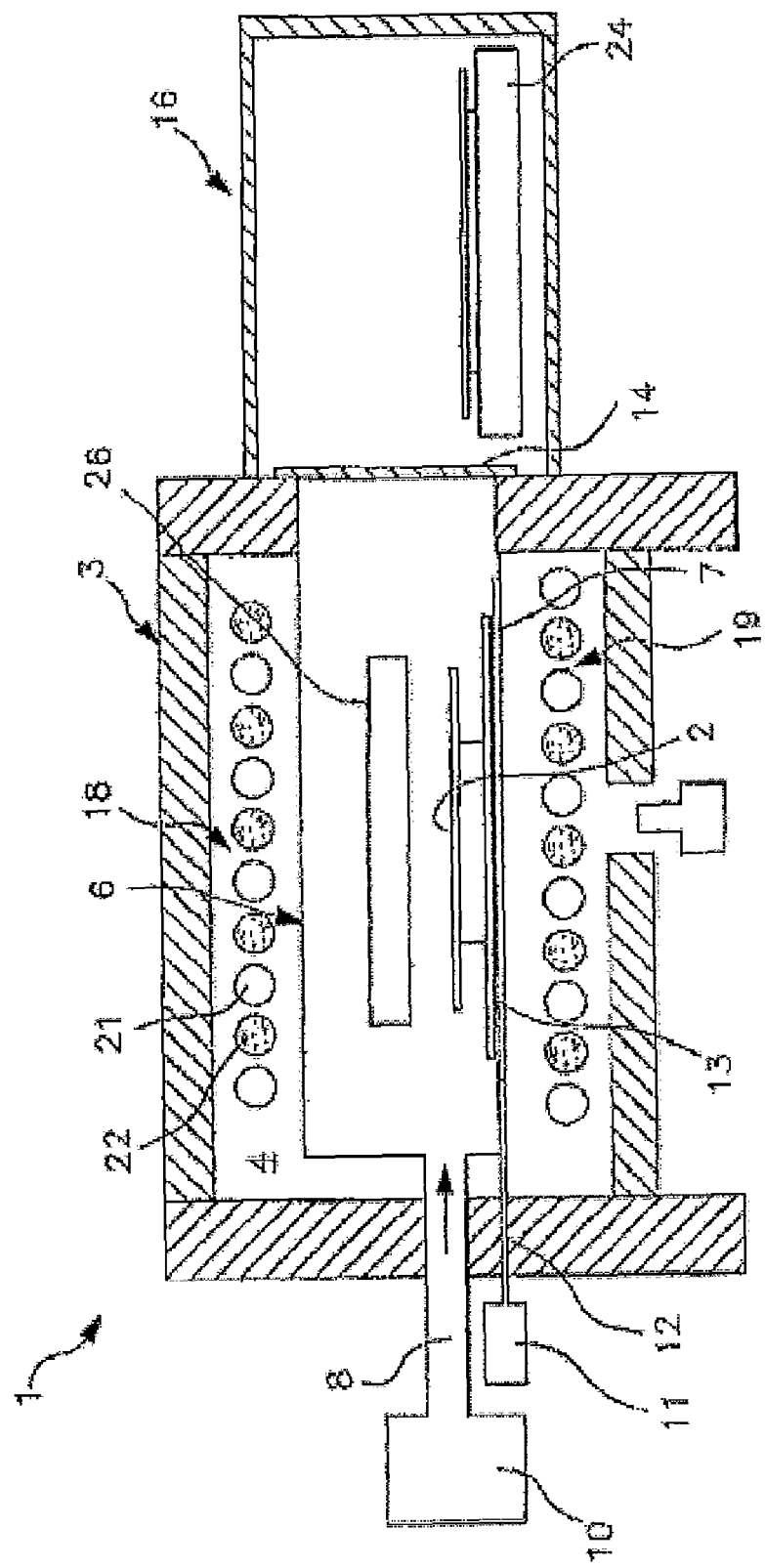
FIG. 1 shows a schematic sectional view of a device for the thermal treatment of a semiconductor wafer.

FIG. 1 shows a schematic illustration of a high-speed heating system 1 for the thermal treatment of substrates such as is known for example, from DE 19923400 which emanates from the same applicant. The device 1 comprises a housing 3 which may comprise a mirrored chamber 4 in the interior thereof. A process chamber 6, which preferably consists of quartz, is provided within the housing 3. A seating member 7 for accommodating and for holding a semiconductor wafer 2 is provided within the process chamber 6. Furthermore, the seating member 7 serves for rotating the semiconductor wafer 2 as will be described in more detail hereinafter. The process chamber 6 has at one end thereof a gas inlet manifold 8 which is connected to at least one gas source 10. A second gas source 11 can be provided adjacent to the gas source 10 and a gas can be introduced into the process chamber 6 from this second gas source, said gas serving for holding and rotating the seating member 7 in floating manner. To this end, the gas source 11 is connected by a line 12 to a nozzle body 13 which is arranged below the seating member 7 and will be described in more detail hereinafter with reference to FIGS. 2a and 2b. An end of the process chamber 6 opposite the gas inlet 8 is closed by a chamber door 14. At the side of the chamber door 14 remote from the process chamber 6, there is provided a lock chamber 16 via which semiconductor wafers 2 are inserted into and removed from the process chamber 6 in known manner.

The process chamber 6 is spaced from an upper and a lower wall of the housing 3, and lamp banks 18, 19 are arranged in the spaces therebetween in order to thermally treat the semiconductor wafer 2 in known manner. Hereby, the lamp banks 18, 19 may comprise both tungsten halogen bulbs 21 and UV lamps 22 or just one sort of lamp in each case.

A seating member 24 is provided in the lock chamber 16 for accommodating and holding a semiconductor wafer 2 before being loaded into the process chamber 6. The seating member 24 keeps the semiconductor wafer 2 closely spaced, and, in the interior thereof, there is a resistance heating element which serves to heat the semiconductor wafer 2 by a process of heating the seating member 24 whilst the semiconductor wafer is held statically thereon i.e. it is kept motionless.

Figure 2A:
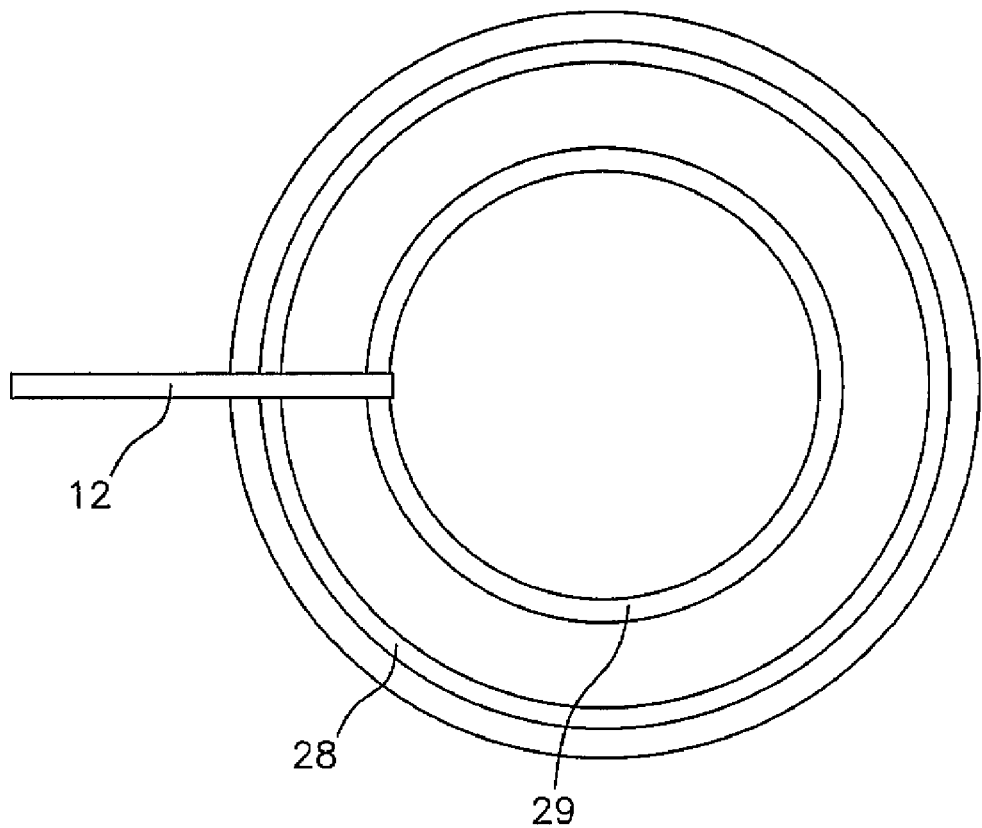
FIG. 2a shows a top view of a part of a rotation device for the device in FIG. 1.
Figure 2B:
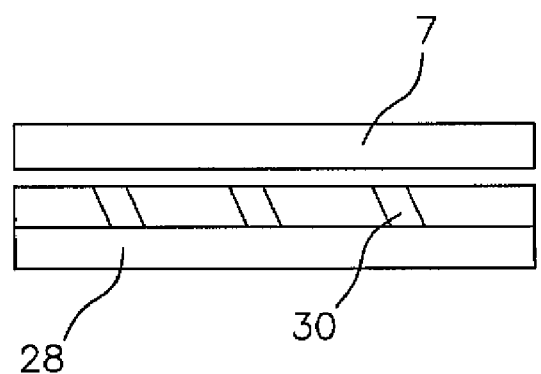

FIG. 2a shows a schematic plan view of the nozzle body 13 which is located below the seating member 7 in the process chamber 6 and is used for introducing a gas for the purposes of holding the seating member 7 in a floating manner. The nozzle body 13 consists of a material such as quartz for example which is transparent to the radiation emitted by the lamps in the lower lamp bank 19. In accordance with FIG. 2a, the nozzle body 13 comprises two essentially ring-shaped channels 28, 29 which are connected in an appropriate manner via a feed line 12 to the gas source 11. The ring-shaped channels 28, 29 can be controlled in an arbitrary manner by appropriate means. Gas outlet nozzles 30, which are directed towards the seating member 7 that is not illustrated in FIG. 2a, extend out from the respective channels 28, 29. As can be perceived from FIG. 2b, the nozzles 30 are inclined with respect to a vertical in order to exert torque on the seating member 7 which is located there above and may be structured on its lower surface. Hereby, the nozzles 30 can be arranged in different directions in the different ring regions 28, 29 so that rotational forces effective in opposite directions are produced by controlling the channels 28, 29 in alternate manner. On the one hand hereby, an acceleration of the rotation can be produced, whilst deceleration thereof can be produced on the other. Naturally, different types of configuration could also be provided for this purpose. The rotation device may also have another type of construction such, for example, as is known from EP 1 034 561 B1 to which reference is made insofar as to avoid repetition.

The operation of the device is described in more detail hereinafter on the basis of an example.

At the beginning of a thermal treatment, a semiconductor wafer 2 is initially loaded into the lock chamber 16 and placed on the seating member 24. Insofar as this is appropriate, a certain gas atmosphere is provided within the lock chamber 16. Subsequently, the seating member 24 is heated by means of the integrated resistance heating element in order to heat up the closely spaced semiconductor wafer 2 located thereon. Hereby, the semiconductor wafer is heated to a temperature of at least 50° C., and preferably to at least 100° C. for example.

After attaining a predetermined temperature T1 or on the expiry of a certain time period t1, the semiconductor wafer 2 is advanced into the process chamber 6 in known manner. Again, a certain gas atmosphere can be provided in the process chamber 6 should this be necessary for the further thermal treatment. The semiconductor wafer 2 is now heated within the process chamber 6 by the upper and lower lamp banks 18, 19. In order to compensate for temperature inhomogeneities over the entire surface of the semiconductor wafer 2, the semiconductor wafer 2 is set in rotation during this heating process. This is effected by introducing a gas from the gas source 1 into the nozzle body 13 and then into the process chamber 6 from the nozzle body 13 via the nozzles 30. Hereby, the nozzles 30 are directed towards the seating member 7 so that a gas cushion can form between the nozzle body 13 and the seating member 7, the seating member 7 being supported in floating manner on said gas cushion. Due to the arrangement of the nozzles 30 such that they are inclined to the vertical, rotation of the seating member 7 can be produced. At the same time, a gas is introduced into the process chamber 6 from the gas source 10 via the line 8. Naturally, although two different gas sources are illustrated in FIG. 1, a single gas source could also be provided, and it is also possible to introduce a gas into the process chamber 6 exclusively via the nozzle body 13.

The semiconductor wafer is exposed to a certain temperature time profile in the process chamber 6, whereby, at an arbitrary time point in this temperature time profile, it is heated to a temperature $T_{max}$ which lies above the temperature at which the semiconductor wafer 2 was loaded into the process chamber 6. The introduction of gas can be changed at will during the thermal treatment, and in particular, it is also possible to change the composition of the process gas atmosphere and/or the pressure of the gas atmosphere within the process chamber 6 during the thermal treatment. It is also possible to change the rotational speed of the seating member 7 or to stop it completely and begin the rotation again. The substrate is cooled down towards the end of the thermal treatment, whereby the movement of the semiconductor wafer 2 and/or the introduction of gas into the process chamber 6 is stopped before the semiconductor wafer attains a temperature which is colder than that of the immediate environment. Hereby, stopping the movement and/or the introduction of gas is determined by the attainment of a temperature T3 or by the expiry of a certain time period t3 of the cooling phase. The temperature T3 is generally lower than the temperature $T_{max}$ and higher than or equal to the temperature T1 of the semiconductor wafer at the end of the initial heating process.

The process cycle in accordance with the invention was described on the basis of an example wherein an initial heating process takes place in the lock chamber 16, whilst a further heating process, which represents the actual thermal treatment, was carried out in the process chamber 6. However, it is also possible in accordance with the invention for a semiconductor wafer 2 to be loaded into the process chamber 6 without being subjected to a previous heating process in the lock chamber 16. In this case, the semiconductor wafer 2 is initially held static, i.e. motionless in the process chamber 6, and/or the supply of gas to the process chamber 6 is switched off. In this state, the semiconductor wafer 2 is heated by the upper and/or lower lamp bank 18 or 19, and after reaching a certain temperature T1 and/or at the expiry of a certain time period t1, the rotation of the semiconductor wafer 2 and/or the introduction of gas into the process chamber 6 is started.

During the initial process of heating the semiconductor wafer 2, the latter is heated exclusively or at least primarily from the rear face thereof in order to prevent photophoretic effects for example being effective toward the front face of the semiconductor wafer 2, this being something which could arise for example, if the wafer 2 is heated by the upper lamp bank 18. Particularly in the lower temperature ranges where the semiconductor wafer 2 can be at least partially transparent to the optical radiation from the lower lamp bank, heating effected predominantly by the lower lamp bank 19 may additionally cause photophoretic effects to be effective away from the front of the semiconductor wafer 2.

Although this is not illustrated in FIG. 1, the semiconductor water 2 can be surrounded by a compensation or guard ring in order to eliminate thermal edge effects. Furthermore, it is also possible to provide a light-absorbing plate 26 above and/or below the semiconductor wafer 2, said light-absorbing plate 26 being effective to absorb the radiation from the lamps in the upper and/or lower lamp bank and convert it into radiant heat having a lower colour temperature. Light-absorbing plates of this type are, for example, known from DE-A-4437361 which emanates from the applicant and U.S. Pat. No. 5,861,609, to which reference may be made insofar as to avoid repetition.

The initial heating process, as well as the following heating process can take place in different gas atmospheres which can differ in regard to the composition thereof and/or the pressure thereof.

For good thermophoretic effects, at least the initial heating process is preferably carried out at approximately ambient pressure. If it takes place in sub-atmospheric conditions, then the influence of the photophoretic effects increases.

The previously mentioned thermophoretic effects can be additionally intensified by exothermic chemical reactions suddenly taking place directly at the substrate surface, e.g. the production of a detonating gas consisting of $H_2$ and $O_2$ directly on the hot wafer in sub-atmospheric conditions (such as approx. 10 torr). Such a boost can also be intensified for example by exothermic physical transformation (e.g. the formation of Poly-Si from amorphous Si) since the crystallization energy freed thereby would contribute directly to the heating of a wafer surface. Processes of this type are particularly advantageously in very low pressure processes wherein photophoretic forces can exceed the thermophoretic forces. Such exothermic reactions can not only keep particles away from a substrate surface by thermophoresis, but they can also loosen particles which may already exist on the wafer surface and which would subsequently be accelerated away from the substrate surface due to the thermophoretic and photophoretic effects.

The exothermic reactions described above can be used in a particularly purposeful manner on the rear face of a wafer in order to cater for a further reduction in the number of particles here.

Figure 3:
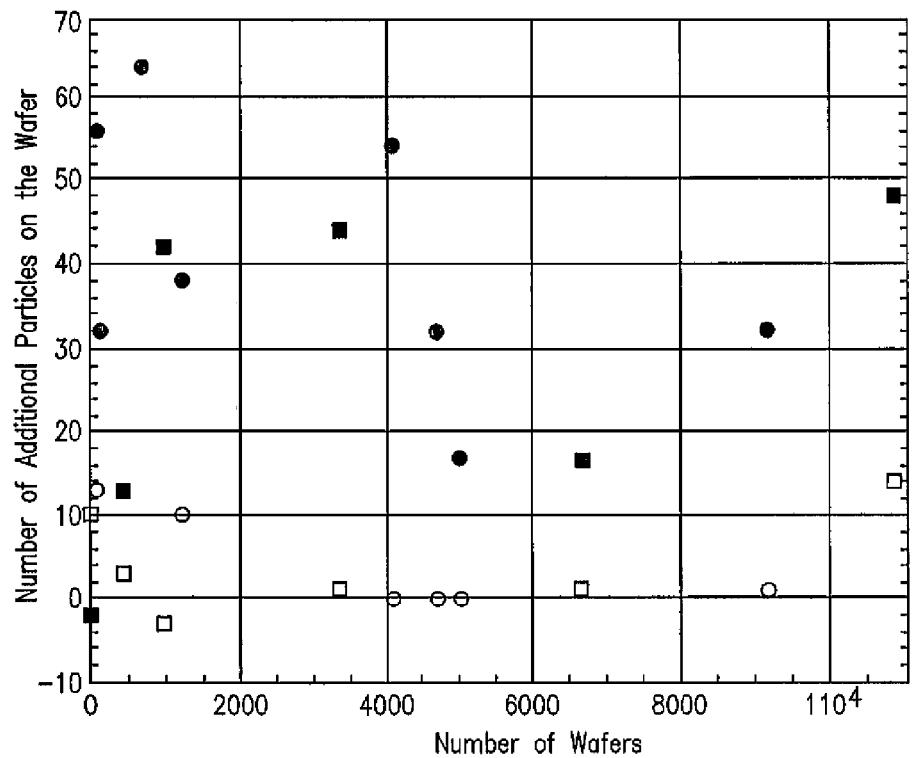
FIG. 3 shows a diagram illustrating the number of additional particles on a wafer after the processing of a number of semiconductor wafers in different process units and with different process cycles.

FIG. 3 shows a diagram illustrating the number of additional particles on a semiconductor wafer after the thermal treatment of a number of semiconductor wafers in different process units using different process cycles. FIG. 3 thus shows the effect of thermophoresis which was determined by random sampling during a production cycle wherein more than 10000 wafer were thermally treated. Two automatic high-speed heating systems for 300 mm disks from the company Mattson working in the atmospheric pressure range were used for the thermal treatment. The number of particles in the random samples before and after the thermal treatment was measured using a particle counter which can detect particles having a size of upwards of 90 nm. The number of additional particles having a size of more than 90 nm is plotted on the vertical axis. The number of thermally treated wafers is plotted on the horizontal axis.

Figure 5:
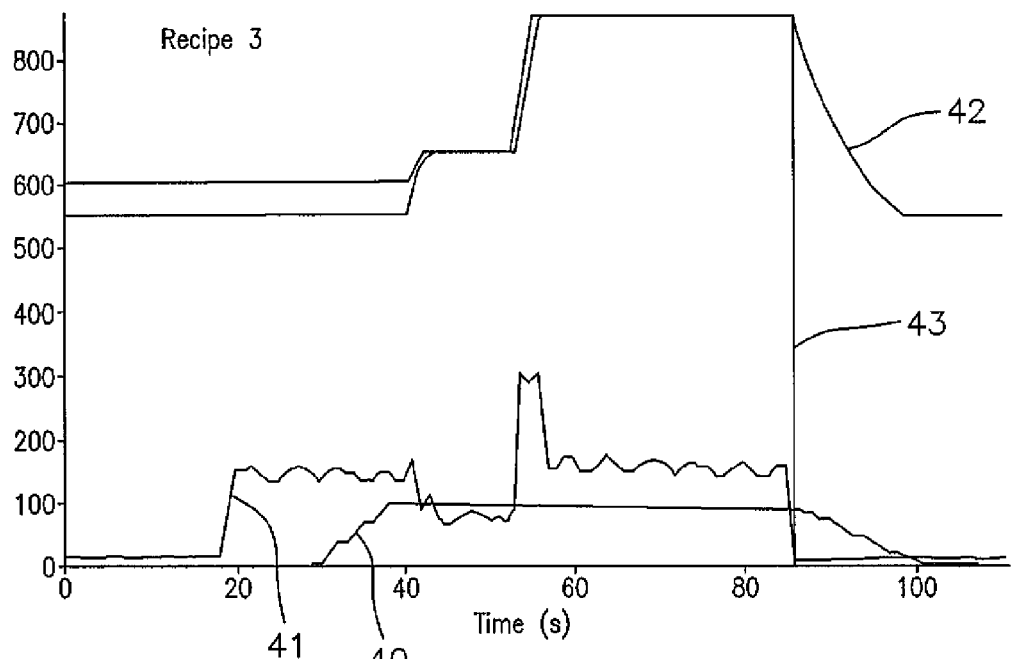
FIGS. 4 to 6 depict respective curves representing different process cycles.
Figure 6:
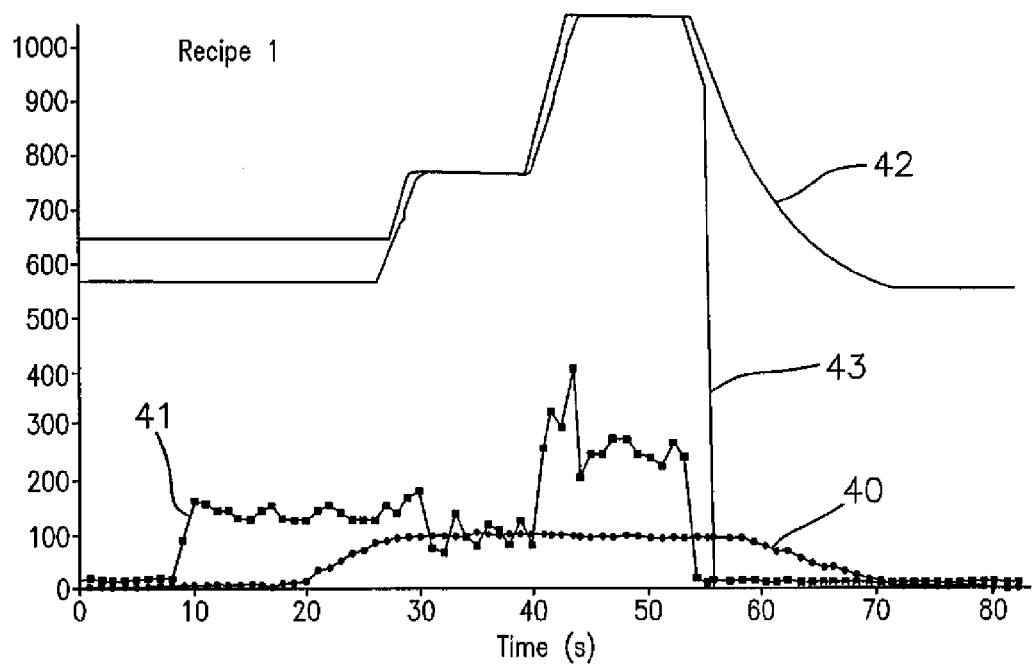

With the exception of the random samples, all of the wafers were subjected to a thermal process at 1050° C. for 10 seconds in each case, this being shown in FIG. 6 (Recipe 1). The wafers were thermally treated in direct succession in order to simulate production conditions such as are encountered by chip manufacturers when manufacturing integrated circuits in automated IC plants. Different thermal treatment processes were carried out with the samples in order to clarify the effect of the procedure, whereby these processes are illustrated in FIGS. 4 and 5.

Figure 4:
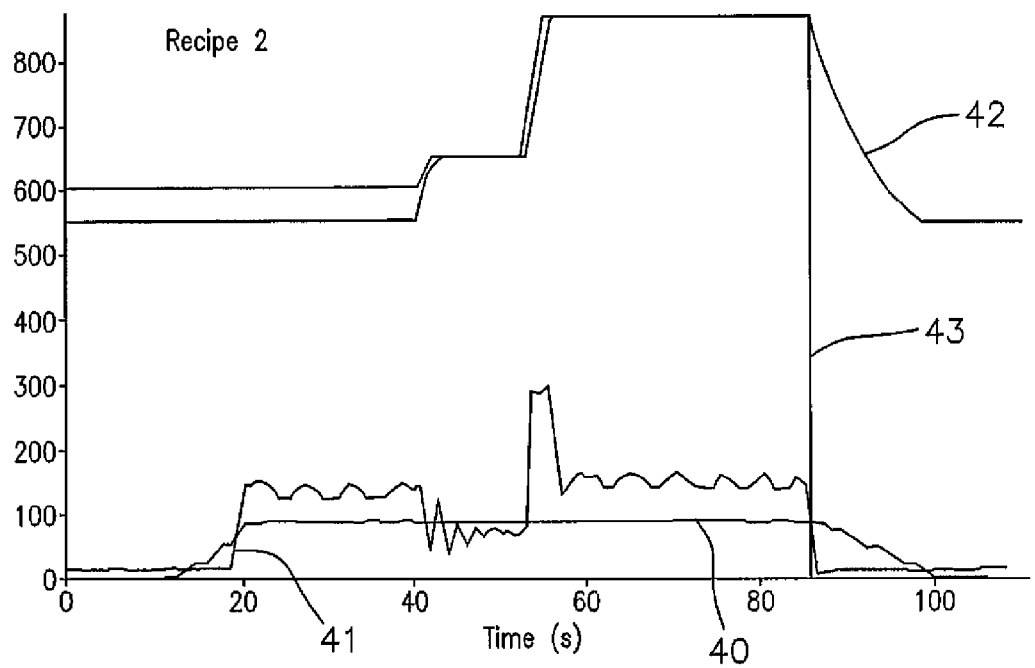

Four curves are plotted as a respective function of time in FIGS. 4 to 6 in order to clarify the thermal processes. Each curve 40 depicts the rotational speed of the wafer about its axis in revolutions/min as a function of time. The curve 41 depicts the heating power of the heating lamps in parts per thousand of the maximum power as a function of time. Each curve 42 depicts the temperature of the semiconductor substrate, which is measured by a pyrometer, as a function of time. In this experiment, the pyrometer only detects temperatures above 550° C., which is why the measurement only represents the actual temperature progression of the semiconductor substrate starting from 580° C. Each curve 43 depicts the adopted temperature set-point (reference value) to which the wafer temperature was regulated.

In the case of Recipe 2 in accordance with FIG. 4, the rotation of the wafer in the chamber was started about 10 seconds before the first heating process, whereas in the case of Recipe 3 (FIG. 5), the rotation of the wafer in the chamber was started about 6 seconds after the beginning of the first heating process. At this point in time, the wafer had reached a temperature of approximately 150 to 200° C.

The filled points in FIG. 3 show the results for the wafers which were treated using Recipe 2, the unfilled points in FIG. 3 show the results for the wafers which were treated using Recipe 3. Hereby, it can easily be perceived that the samples which were treated using Recipe 3 comprise a far smaller number of additional particles than the samples which were treated using Recipe 2. It should be mentioned hereby that this measurement was carried out in two different plants, whereby the square and the round symbols symbolize the different plants. It is clearly apparent that in both cases the number of additional particles could be substantially reduced by the procedure in accordance with the invention wherein rotation of a wafer only takes place after an initial heating process.

The invention has been described hereinabove on the basis of preferred exemplary embodiments although numerous arrangements and modifications will occur to the skilled person without leaving the scope and spirit of the invention.

Thus, for example, a resistance heating element was used in the lock chamber 16 in order to heat up the semiconductor wafer 2 located therein. Naturally, it is also possible to provide other means for heating the semiconductor wafer 2 in the lock chamber such as a lamp bank for example. It is also possible, for the semiconductor wafer to be initially and then further thermally treated in succession in two process chambers such as the process chamber 6. Although the illustrated rotational device using the introduction of a gas can be advantageous since it produces relatively few particles, rotational devices other than the concretely illustrated one are also naturally employable. Thus, for example, electrical, magnetic, electromagnetic, pneumatic or mechanical rotation devices could be provided. Furthermore, the procedure in accordance with the invention is also employable to advantage in connection with other devices and procedures for the thermal treatment of substrates in order to keep the number of particles on a substrate as small as possible during a thermal treatment utilising simple means.

The invention claimed is:

1. A method for the thermal treatment of disk-shaped substrates comprising:
   heating a substrate in a first process step to a first temperature which is higher than that of an immediate environment while the substrate is contained in a first process chamber and is kept static, wherein the first process chamber containing the substrate contains a gas at least during the first process step, whereby the substrate is heated more rapidly during the heating thereof than is the gas surrounding the substrate; and
   heating the substrate in a second process step to a second temperature that is higher than the first temperature, the substrate being rotated during the second process step.

2. A method in accordance with claim 1, characterised in that the end of the first process step is determined by the attainment of a first temperature (T1) of the substrate or by the expiry of a certain time period (t1).

3. A method in accordance with claim 2, characterised in that the first process step is determined by the expiry of a certain time period and wherein the certain time period (t1) amounts to at least 2 seconds and less than 5 seconds.

4. A method in accordance with claim 1, characterised in that the substrate is moved from the first to a second process chamber between the first and second process steps.

5. A method in accordance with claim 4, wherein the substrate is heated by a first heater in the first process chamber and by a second heater in the second process chamber, the first heater being a different type of heater than the second heater, the second heater comprising at least one heating lamp.

6. A method in accordance with claim 1, characterised in that a gas atmosphere in the process chamber containing the substrate has a pressure of between 700 and 900 torr.

7. A method in accordance with claim 1, characterised in that the gas atmosphere in the process chamber containing the substrate is changed.

8. A method in accordance with claim 1, characterised in that the gas contained in the first process chamber containing the substrate has a temperature before heating which is lower than that of the substrate.

9. A method in accordance with claim 1, characterised in that the gas is an at least a partially ionised gas.

10. A method in accordance with claim 9, characterised in that the polarity of the ionised gas is changed.

11. A method in accordance with claim 9, characterised in that the gas is ionised within the process chamber.

12. A method in accordance with claim 1, characterised in that at least one of the process steps is carried out in a sub-atmospheric pressure range.

13. A method in accordance with claim 1, characterised in that, at least during the first process step, the substrate is heated to a greater extent from one side than an opposite side.

14. A method in accordance with claim 13, characterised in that the heating power on the one side is greater by at least 50% than on the other side.

15. A method in accordance with claim 13, characterised in that the substrate is heated exclusively from the one side.

16. A method in accordance with claim 13, characterised in that the one side is a rear face of a semiconductor wafer.

17. A method in accordance with claim 1, characterised in that the substrate is heated by radiation from at least one heating lamp at least in the second process step.

18. A method in accordance with claim 17, characterized by at least one element which is arranged in a vicinity of the substrate, and which absorbs the radiation from the lamp and radiates radiant heat having a lower colour temperature than that of the radiation from the lamp.

19. A method in accordance with claim 18, characterised in that the element absorbing the radiation from the lamp is arranged between the at least one heating lamp and the substrate.

20. A method in accordance with claim 1, characterised in that the substrate is set in rotation by a gas introduced into the process chamber during the second process step.

21. A method in accordance with claim 1, characterised in that the substrate is held in floating manner by a gas that is introduced into the process chamber during the second process step.

22. A method in accordance with claim 20, characterised in that the gas introduced into the process chamber during the second process step is a process gas for processing the substrate.

23. A method in accordance with claim 1, wherein the substrate is not cooled in between the first process step and the second process step.

24. A method in accordance with claim 23, characterised in that the substrate is moved from the first to a second process chamber between the first and second process steps.

25. A method for the thermal treatment of disk-shaped substrates comprising:
heating a substrate in a first process step to a first temperature which is higher than that of an immediate environment while the substrate is contained in a first process chamber and is kept static, wherein the substrate is heated to a temperature of at least 100° C. and less than 400° C. in the first process step; and
heating the substrate in a second process step to a second temperature that is higher than the first temperature, the substrate being rotated during the second process step.

26. A method in accordance with claim 25, characterised in that the substrate is moved from the first to a second process chamber between the first and second process steps.

27. A method in accordance with claim 25, characterised in that a gas is introduced into a process chamber containing the substrate.

28. A method in accordance with claim 27, characterised in that the gas introduced into the process chamber containing the substrate has a temperature which is lower than that of the substrate.

29. A method in accordance with claim 27, wherein the gas is introduced into a process chamber containing the substrate only during the second process step.

30. A method in accordance with claim 25, characterised in that no gas is introduced into the process chamber containing the substrate during the first process step.

31. A method in accordance with claim 25, characterised in that a gas is withdrawn from the process chamber containing the substrate at least during the first process step.

32. A method for the thermal treatment of disk-shaped substrates comprising:
heating a substrate in a first process step to a first temperature which is higher than that of an immediate environment while the substrate is contained in a first process chamber and is kept static;
heating the substrate in a second process step to a second temperature that is higher than the first temperature, the substrate being rotated during the second process step; and
cooling the substrate in a third process step, whereby the movement of the substrate is stopped at the end of the third process step before the substrate is colder than its immediate environment.

33. A method in accordance with claim 32, characterised in that the end of the third process step is determined by the attainment of a third temperature (T3) or by the expiry of a certain time period (t3).

34. A method in accordance with claim 32, characterised in that, in the third process step, the substrate is cooled down to a third temperature (T3) which is lower than the second temperature and is higher than or equal to the first temperature.

* * * * *